United States Patent
Quelen

(10) Patent No.: US 10,127,953 B2
(45) Date of Patent: Nov. 13, 2018

(54) CIRCUIT FOR SELECTING A POWER SUPPLY VOLTAGE HAVING A CONTROLLED TRANSITION

(71) Applicant: Commissariat à l'Énergie Atomique et aux Énergies Alternatives, Paris (FR)

(72) Inventor: Anthony Quelen, Seyssins (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/628,074

(22) Filed: Jun. 20, 2017

(65) Prior Publication Data

US 2018/0012635 A1  Jan. 11, 2018

(30) Foreign Application Priority Data

Jul. 7, 2016 (FR) .................................... 16 56566

(51) Int. Cl.
| | |
|---|---|
| *G11C 16/30* | (2006.01) |
| *G11C 5/14* | (2006.01) |
| *H02J 9/06* | (2006.01) |
| *H03K 17/16* | (2006.01) |
| *H03K 17/693* | (2006.01) |
| *H03K 19/0944* | (2006.01) |
| *H02J 1/10* | (2006.01) |

(52) U.S. Cl.
CPC ................ *G11C 5/147* (2013.01); *H02J 1/10* (2013.01); *H02J 9/06* (2013.01); *H03K 17/16* (2013.01); *H03K 17/693* (2013.01); *H03K 19/0944* (2013.01); *G11C 16/30* (2013.01)

(58) Field of Classification Search
CPC .......... G11C 5/147; G11C 5/14; G11C 16/06; G11C 16/08; G11C 16/30; H02J 9/06; H03K 17/16; H03K 17/693; H03K 19/0944
USPC ..... 365/185.18, 189.02, 189.05, 189.09, 226
See application file for complete search history.

(56) References Cited

U.S. PATENT DOCUMENTS

| | | | |
|---|---|---|---|
| 6,891,425 B1 | 5/2005 | Huynh | |
| 8,498,158 B2 * | 7/2013 | Chiang | .................... G11C 7/02 365/185.18 |

(Continued)

FOREIGN PATENT DOCUMENTS

EP  2388881 A2  11/2011

OTHER PUBLICATIONS

French Search Report for Application No. FR 16/56566 dated Mar. 13, 2017.

*Primary Examiner* — Tan T. Nguyen
(74) *Attorney, Agent, or Firm* — Wolf, Greenfield & Sacks, P.C.

(57) ABSTRACT

A voltage selection circuit, including: first and second nodes of application of first and second input voltages; a third output voltage supply node; first and second MOS transistors respectively coupling the first and third nodes and the second and third nodes; and a control circuit capable of keeping the first and second transistors either respectively on and off or respectively off and on, the control circuit including a feedback loop from the third node to the gate of the first transistor and being capable, during a transition phase, of controlling the first transistor in linear operating region to apply a DC voltage ramp to the third node.

12 Claims, 4 Drawing Sheets

(56) References Cited

U.S. PATENT DOCUMENTS

| | | | |
|---|---|---|---|
| 2005/0180068 A1* | 8/2005 | Lopata | G06F 1/263 361/18 |
| 2005/0264271 A1* | 12/2005 | Lam | H02M 1/10 323/282 |
| 2010/0164460 A1 | 7/2010 | Hsiao et al. | |
| 2012/0056655 A1* | 3/2012 | Brauer | H03K 17/166 327/170 |

* cited by examiner

CIRCUIT FOR SELECTING A POWER SUPPLY VOLTAGE HAVING A CONTROLLED TRANSITION

CONTROLLED TRANSITION

This application claims priority to French patent application number 16/56566, filed Jul. 7, 2016, the content of which is hereby incorporated by reference in its entirety to the maximum extent allowable.

BACKGROUND

The present disclosure generally relates to the field of electronic circuits, and more particularly aims at a circuit for selecting a power supply voltage, for example, for an integrated circuit.

DISCUSSION OF THE RELATED ART

In certain electronic devices, it is desired to be able to modify the level of the power supply voltage of an electronic circuit, for example, to optimize the management of the electric energy in the device. Preferably, it should be possible to dynamically perform such a modification at the power supply voltage level, that is, without interrupting the operation of the integrated circuit.

FIG. 1 is a simplified electric diagram of an example of a power supply voltage selection circuit. The circuit of FIG. 1 comprises two MOS power transistors SW1 and SW2. Transistor SW1 couples, via its conduction nodes (source and drain), a node 101 of application of a first power supply voltage VDD1 to a node 102 for supplying an output power supply voltage VCORE. Transistor SW2 couples, via its conduction nodes, a node 103 of application of a second input power supply voltage VDD2 smaller than voltage VDD1 to node VCORE. The voltage selection circuit of FIG. 1 further comprises a control circuit 104 connected to the gates of transistors SW1 and SW2, configurable to, in a first configuration, keep transistors SW1 and SW2 respectively on (conducting) and off (non-conducting) and, in a second configuration, keep transistors SW1 and SW2 respectively off and on. In the first configuration, voltage VCORE at node 102 is substantially equal to voltage VDD1 and, in the second configuration, voltage VCORE at node 102 is substantially equal to voltage VDD2. Node 102 is intended to be connected to a power supply node of a load (not shown), for example, an integrated circuit. Thus, the circuit of FIG. 1 enables, via its control circuit 104, to select one or the other of voltages VDD1 and VDD2 to power the load circuit.

A problem which is posed in such a voltage selection circuit is that of controlling transitions between the first and second configurations. In particular, to limit energy losses, transistors SW1 and SW2 are generally selected to have low on-state series resistances. Thus, if the two transistors SW1 and SW2 are simultaneously on, even for a short time, a strong current flows between nodes 101 and 103, which may cause damage. Further, if the two transistors SW1 and SW2 are simultaneously off, even for a short time, a voltage drop may occur on node 102, which may result in malfunctions of the load circuit.

FIG. 2 is a simplified electric diagram illustrating an example of architecture of a power supply voltage selection circuit which has been provided to attempt solving this problem.

In this example, the power supply voltage VDD1 applied to node 101 is considered to be greater than the input power supply voltage VDD2 applied to node 103. In the circuit of FIG. 2, transistor SW1 of FIG. 1 is replaced with a plurality of elementary transistors $SW1_i$ of smallest dimensions (and thus having a higher on-state series resistance) connected in parallel between nodes 101 and 102 (i being an integer in the range from 1 to n and n being an integer greater than 1). The gates of elementary transistors $SW1_i$ and of transistor SW2 are connected to a digital control circuit 201. Elementary transistors $SW1_i$ are individually controllable to be set to the off state or to the on state by control circuit 201. Control circuit 201 is configurable to, in a first configuration, keep all transistors $SW1_i$ on and transistor SW2 off, to apply a voltage VDD1 to node 102 and, in a second configuration, keep all transistors $SW1_i$ off and transistor SW2 on, to apply voltage VDD2 onto node 102. Control circuit 201 is further connected to node VCORE and comprises a digital feedback loop enabling, during phases of transition between the first and second configurations, to turn on/off one by one transistors $SW1_i$ to control the rise/fall speed of voltage VCORE on node 102.

Examples of architectures of this type are particularly described in publications entitled "A Power Supply Selector for Energy- and Area-Efficient Local Dynamic Voltage Scaling" (Sylvain Miermont, PATMOS 2007, LNCS 4644, pp. 556-565), "Advanced Control Design for Voltage Scaling Converters" (Carolina Albea, Industrial Electronics, 2008. IECON 2008. 34th Annual Conference of IEEE), "High Performance Control Design for Dynamic Voltage Scaling Devices" (Carolina Albea, IEEE TRANSACTIONS ON CIRCUITS AND SYSTEMS—I: REGULAR PAPERS, VOL. 58, No. 12, DECEMBER 2011), and "Robust Saturated Control for Low-Power Circuits" (Carolina Albea, IEEE TRANSACTIONS ON CONTROL SYSTEMS TECHNOLOGY, VOL. 21, No. 2, MARCH 2013).

A disadvantage of this type of architecture is the need to supply the control circuit with a clock signal (not shown) of relatively high frequency (typically several hundreds of MHz), which results in a high electric power consumption during phases of transition between the first and second configurations. Further, during phases of transition between the first and second configurations, a ripple of voltage VCORE, induced by the digital regulation speed, may occur on node 102. Further, this type of architecture does not enable to totally avoid drops of voltage VCORE on node 102, nor the flowing of high currents between nodes 101 and 103, during phases of transition between the first and second configurations. Further, this type of architecture may be subject to malfunctions if the load current drawn from node 102 by the load circuit is too high or fluctuates during phases of transition between the first and second configurations.

It would be desirable to have a power supply voltage selection circuit, such a circuit overcoming all or part of the disadvantages of existing circuits.

SUMMARY

Thus, an embodiment provides a power supply voltage selection circuit, comprising: first and second nodes capable of respectively receiving first and second input power supply voltages; a third node capable of supplying an output power supply voltage; a first MOS power transistor coupling the first node to the third node; a second MOS power transistor coupling the second node to the third node; and a control circuit capable, in a first configuration, of keeping the first and second transistors respectively on and off and, in a second configuration, of keeping the first and second transistors respectively off and on, the control circuit comprising a feedback loop from the third node to the gate of the first transistor, and being capable, during a phase of transition from the first to the second configuration or from the second to the first configuration, of controlling the first transistor in linear operating region to apply a DC voltage ramp to the third node.

According to an embodiment, the control circuit comprises: a voltage ramp generator; and a first linear regulation circuit having a first input node connected to the third node, having a second input node connected to an output node of the ramp generator, and having an output node connected to the gate of the first transistor.

According to an embodiment, the first linear regulation circuit is capable of adjusting a control signal applied, via its output node, to the gate of the first transistor, to control the output voltage with a target voltage applied to its second input node.

According to an embodiment, the selection circuit further comprises a linear regulation circuit having a first input node connected to the third node, having a second input node connected to an output node of the ramp generator, and having an output node connected to the gate of the second transistor.

According to an embodiment, the selection circuit further comprises a circuit for detecting a reversal of the current flowing through the second transistor.

According to an embodiment, the detection circuit comprises a measurement transistor arranged to conduct a measurement current proportional to the current flowing through the second transistor, and a current comparator capable of comparing said measurement current with a threshold.

According to an embodiment, the selection circuit further comprises a circuit for comparing the output voltage with a threshold.

According to an embodiment, the selection circuit further comprises a circuit for generating a predetermined delay.

According to an embodiment, the first MOS power transistor is coupled to the first node via a first additional MOS transistor having off-state leakage currents smaller than that of the first MOS power transistor, and the second MOS power transistor is coupled to the second node via a second additional MOS transistor having off-state leakage currents smaller than that of the second MOS power transistor.

According to an embodiment, the control circuit is capable, in a third configuration, of keeping the first and second MOS power transistors and the first and second additional MOS transistors in the off state.

According to an embodiment, the first input power supply voltage is greater than the second input power supply voltage, the control circuit being capable, during a phase of decreasing transition between the first and second configurations, of: controlling the first transistor in linear operating region to apply a decreasing DC voltage ramp to the third node; detecting a switching of the output voltage to a level substantially equal to that of the second input power supply voltage; and when the output voltage reaches a level substantially equal to that of the second input power supply voltage, turning on the MOS power transistors and turning off the first MOS power transistor.

According to an embodiment, the first input power supply voltage is greater than the second input power supply voltage, the control circuit being capable, during a phase of increasing transition between the first and second configurations, of: controlling the first transistor in linear operating region to apply an increasing DC voltage ramp to the third node; detecting an inversion of the current flowing through the second transistor; when the current flowing through the second transistor reverses, turning off the second transistor; and after a predetermined delay, turning on the first MOS power transistor.

The foregoing and other features and advantages will be discussed in detail in the following non-limiting description of dedicated embodiments in connection with the accompanying drawings.

DETAILED DESCRIPTION

Figure 1:
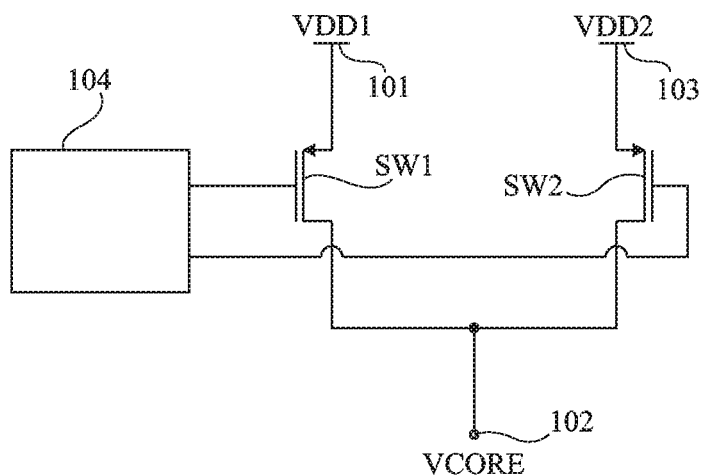
FIG. 1, previously described, is a simplified electric diagram of an example of a power supply voltage selection circuit.
Figure 2:
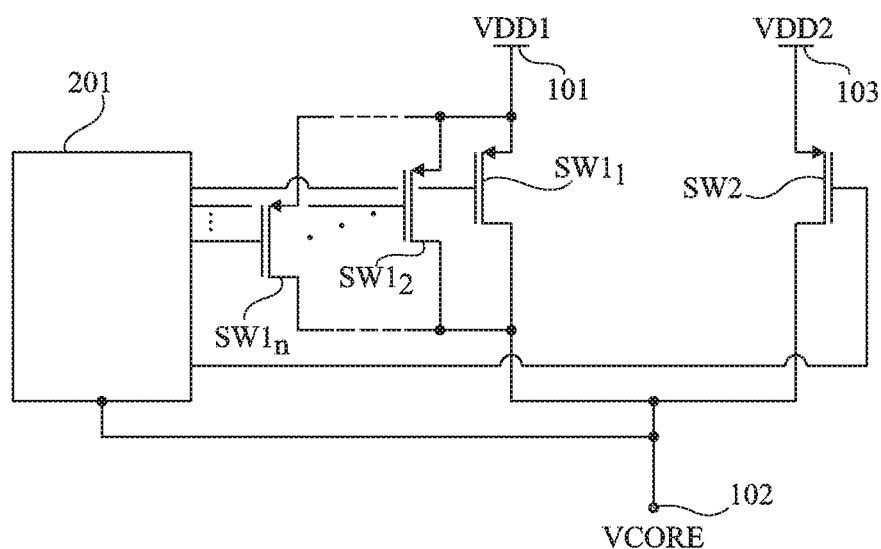
FIG. 2, previously described, is a simplified electric diagram of another example of a power supply voltage selection circuit.

The same elements have been designated with the same reference numerals in the different drawings and, further, the various drawings are not to scale. For clarity, only those elements which are useful to the understanding of the described embodiments have been shown and are detailed. In particular, the various uses which may be made of the described power supply voltage selection circuits have not been detailed, the described embodiments being compatible with usual applications of power supply voltage selection circuits. Unless otherwise specified, expressions "approximately", "substantially", and "in the order of" mean to within 10%, preferably to within 5%. Further, term "connected" is used to designate a direct electric connection, with no intermediate electronic component, for example, by means of one or a plurality of conductive tracks or conductive wires, and term "coupled" or term "linked" is used to designate an electric connection which may be direct (then meaning "connected") or indirect (that is, via one or a plurality of intermediate components).

According to an aspect of an embodiment, a power supply voltage selection circuit of the type described in relation with FIG. 1, but where transistors SW1 and/or SW2 are controlled in linear operating region during phases of transition between the first and second configurations, is provided, to control the variation of voltage VCORE on node 102.

Figure 3:
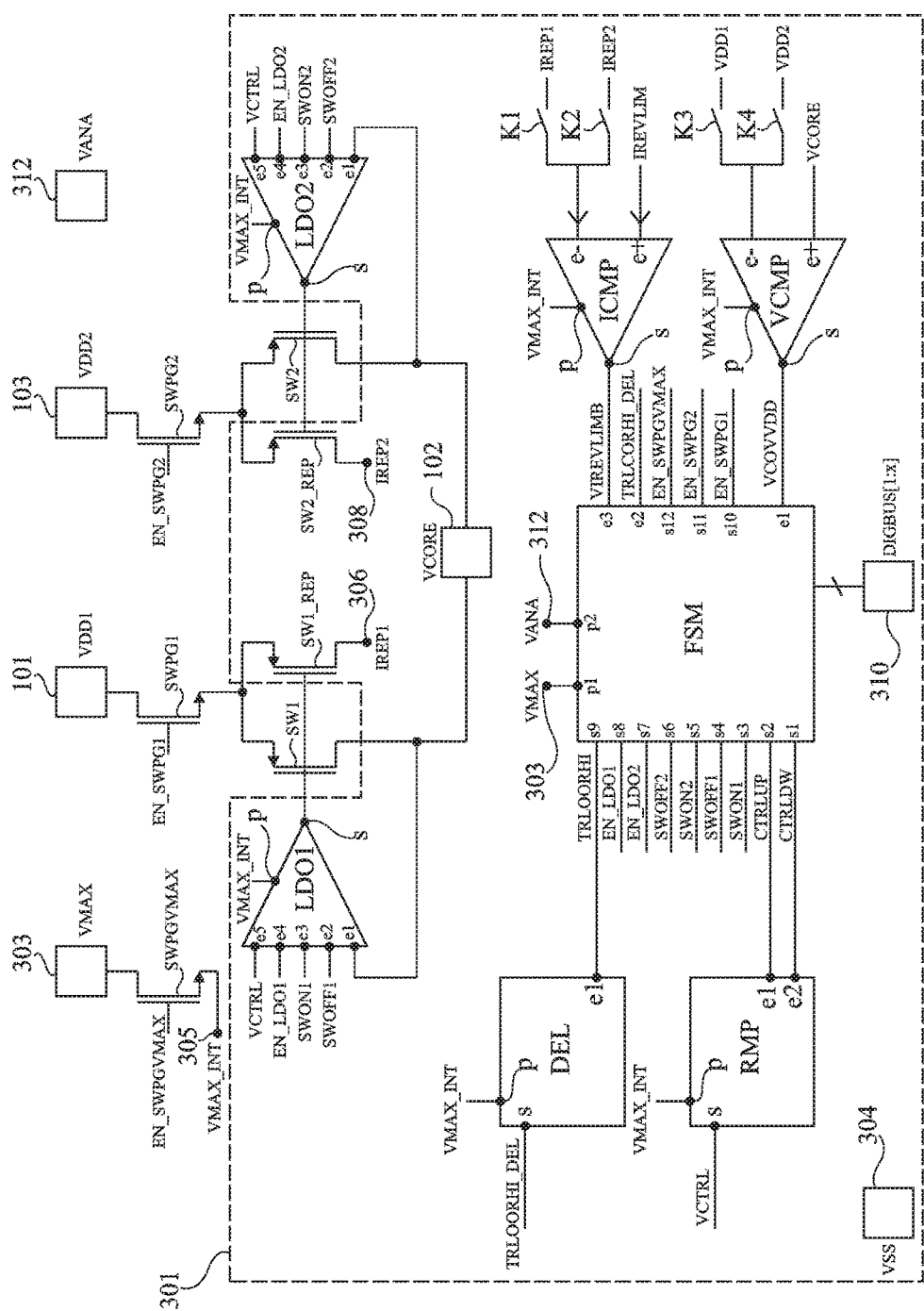
FIG. 3 is an electric diagram of an example of a power supply voltage selection circuit according to an embodiment.

FIG. 3 is an electric diagram illustrating an example of a power supply voltage selection circuit according to an embodiment.

The circuit of FIG. 3 comprises two MOS power transistors SW1 and SW2. Transistor SW1 couples, via its conduction nodes (source and drain), a node or a terminal 101 of application of a first input power supply voltage VDD1 to a node or a terminal 102 for supplying a DC output power supply voltage VCORE, and transistor SW2 couples, via its conduction nodes, a node or a terminal 103 of application of a second DC input power supply voltage VDD2 to node 102 for supplying voltage VCORE. In the example of FIG. 3, the conduction node of transistor SW1, respectively SW2, opposite to node 102 is not directly connected to node 101, respectively 103, but is coupled to node 101, respectively 103 via a MOS transistor SWPG1, respectively SWPG2. In the shown example, transistors SW1 and SW2 are P-channel MOS transistors, and transistors SWPG1 and SWPG2 are N-channel MOS transistors. Transistors SW1 and SW2 have their drains connected to node 102, and their sources respectively connected to the source of transistor SWPG1 and to the source of transistor SWPG2. Transistors SWPG1 and SWPG2 have their drains respectively connected to node 101 and to node 102.

The voltage selection circuit of FIG. 3 further comprises a control circuit 301 connected to the gates of transistors SW1 and SW2, configurable to, in a first configuration, keep transistors SW1 and SW2 respectively on and off and, in a second configuration, keep transistors SW1 and SW2 respectively off and on. In the first configuration, voltage VCORE on node 102 is substantially equal to voltage VDD1 and, in the second configuration, voltage VCORE on node 102 is substantially equal to voltage VDD2. It should be noted that, in operation, transistors SWPG1, respectively SWPG2, are kept on when transistors SW1, respectively SW2, are controlled to be set to the on state. As will be explained in further detail in relation with FIGS. 4 and 5, transistors SWPG1, SWPG2 are only used to limit leakages through transistors SW1, SW2 when the latter are in the off state. As an example, when the selection circuit is not in use, that is, when none of input power supply voltages VDD1, VDD2 is selected to power node 102, transistors SW1, SW2 are set to the off state, and transistors SWPG1 and SWPG2 may be kept in the off state to limit leakages to ground particularly through transistors SW1 and SW2.

Control circuit 301 comprises an analog feedback loop from node 102 to the gate of transistor SW1, and an analog feedback loop from node 102 to the gate of transistor SW2. Circuit 301 is capable, during phases of transition from the first to the second configuration or from the second to the first configuration, of controlling transistor SW1 or transistor SW2 in linear operating region to apply a predetermined voltage ramp to node 102, and thus control the variation of voltage VCORE.

In the example of FIG. 3, the voltage selection circuit is provided to be able to operate indifferently whether the input power supply voltage VDD1 applied to node 101 is greater or smaller than the input power supply voltage VDD2 applied to node 103. This provides a greater flexibility of use, particularly when the circuit is assembled in an electronic device. As will be explained in further detail hereafter, the circuit may however be simplified when it is known in advance which of input power supply voltages VDD1 and VDD2 is the highest.

The voltage selection circuit of FIG. 3 comprises a node or a terminal 303 intended, in operation, to receive a power supply voltage VMAX substantially equal to the highest of the two input power supply voltages VDD1 and VDD2. In the shown example, node 303 is coupled to a node 305 for supplying an internal power supply voltage VMAX_INT via a MOS transistor SWPGVMAX. In the shown example, transistor SWPGVMAX is an N-channel MOS transistor having its drain connected to node 303 and having its source connected to node 305. The voltage selection circuit of FIG. 3 further comprises a node or a terminal 304 intended to receive a reference potential VSS, for example, the ground, having all the circuit voltages referenced thereto.

In the example of FIG. 3, transistors SWPG1, SWPG2, SWPGVMAX have the function of limiting leakage currents in the voltage selection circuit. In particular, transistors SWPG1, SWPG2 are selected to have off-state leakages smaller than those of transistors SW1, SW2. Transistors SWPG1, SWPG2, SWPGVMAX are for example identical to each other, to within manufacturing dispersions. These transistors are for example more resistive than transistors SW1, SW2. It may then be advantageous, in order to drive transistors SWPG1, SWPG2, SWPGVMAX, to apply control voltages EN_SWPG1, EN_SWPG2, EN_SWPGVMAX having a level higher than power supply voltage VMAX of the circuit onto their gates. To achieve this, in the example of FIG. 3, the voltage selection circuit further comprises a node or a terminal 312 of application of a DC power supply voltage VANA greater than voltage VMAX. As an example, transistors SW1, SW2 are faster than transistors SWPG1, SWPG2, SWPGVMAX. Transistors SW1, SW2 for example have a thinner gate oxide than transistors SWPG1, SWPG2, SWPGVMAX. As an example, transistor SWPGVMAX may be controlled to be set to the off state when the selection circuit is not being used, that is, when none of input power supply voltages VDD1, VDD2 is selected to power node 102, in order to limit leakages to ground.

Control circuit 301 comprises a linear regulation circuit LDO1 having an input node e1 connected to node 102 and having an output node s connected to the gate of transistor SW1. Circuit LDO1 forms an analog feedback loop capable of controlling transistor SW1 in linear operating region in order to control voltage VCORE supplied on node 102. In the shown example, regulation circuit LDO1 comprises an input node e5 intended to receive a target voltage VCTRL to be transferred onto node 102. Circuit LDO1 is capable of adjusting the control signal applied, via its node s, to the gate of transistor SW1, in order to control voltage VCORE with target voltage VCTRL. In this example, regulation circuit LDO1 further comprises an input node e4 intended to receive a signal EN_LDO1 for enabling the regulation mode of circuit LDO1, an input node e3 intended to receive a signal SWON1 for controlling the setting of transistor SW1 to the on (conducting) state, and an input node e2 intended to receive a signal SWOFF1 for controlling the setting of transistor SW1 to the off (non-conducting) state. Regulation circuit LDO1 further comprises a power supply node p coupled to node 305 for supplying internal power supply voltage VMAX_INT.

Control circuit 301 further comprises a linear regulation circuit LDO2 having an input node e1 connected to node 102 and having an output node s connected to the gate of transistor SW2. Circuit LDO2 forms a feedback loop capable of controlling transistor SW2 in linear operating region in order to control voltage VCORE supplied onto node 102. In the shown example, regulation circuit LDO2 comprises an input node e5 intended to receive a target voltage VCTRL to be transferred onto node 102. Circuit LDO2 is capable of adjusting the control signal applied, via its node s, to the gate of transistor SW2, to control voltage VCORE with target voltage VCTRL. In this example, regulation circuit LDO2 further comprises an input node e4 intended to receive a signal EN_LDO2 for enabling the regulation mode of circuit LDO2, an input node e3 intended to receive a signal SWON2 for controlling the setting of transistor SW2 to the on (conducting) state, and an input node e2 intended to receive a signal SWOFF2 for controlling the setting of transistor SW2 to the off (non-conducting) state. Regulation circuit LDO2 further comprises a power supply node p coupled to node 305 for supplying internal power supply voltage VMAX_INT. Regulation circuit LDO2 is for example identical or similar to regulation circuit LDO1. Embodiments of linear regulation circuits LDO1, LDO2 will be detailed hereafter in relation with FIGS. 6 and 7.

Control circuit 301 further comprises a voltage ramp generation circuit RMP. Circuit RMP comprises an output node s coupled to input nodes e5 of linear regulation circuits LDO1 and LDO2 and supplying the target voltage VCTRL applied to circuits LDO1 and LDO2. In the shown example, circuit RMP comprises an input node e1 intended to receive a control signal CTRLUP and an input node e2 intended to receive a control signal CTRLDW. Circuit RMP is capable, when control signal CTRLUP is activated, of generating on its node s a predetermined increasing voltage ramp ranging from the lowest of voltages VDD1 and VDD2 to the highest of voltages VDD1 and VDD2 and, when control signal CTRLDW is activated, of generating on its node s a predetermined decreasing voltage ramp from the highest of voltages VDD1 and VDD2 to the lowest of voltages VDD1 and VDD2. Circuit RMP further comprises a power supply node p coupled to node 305 for supplying internal power supply voltage VMAX_INT. The forming of the voltage ramp generation circuit RMP has not been detailed, the described embodiments being compatible with all or part of known voltage ramp generation circuits.

Control circuit 301 further comprises a circuit DEL for generating a predetermined delay. Circuit DEL comprises an input node e1 intended to receive a signal TRLOORHI, and an output node s. Circuit DEL is capable of supplying, on its output node s, a signal TRLOORHI_DEL which is a delayed image of input signal TRLOORHI. More particularly, circuit DEL is capable of copying on its output s, with a predetermined delay, a state change of signal TRLOORHI applied to its input node e1. Circuit DEL further comprises a power supply node p coupled to node 305 for supplying internal power supply voltage VMAX_INT. The forming of delay generation circuit DEL has not been detailed, the described embodiments being compatible with all or part of known delay generation circuits.

Control circuit 301 of FIG. 3 further comprises a MOS transistor SW1_REP having its gate connected to the gate of transistor SW1 and having its conduction nodes respectively connected to the common conduction node of transistors SW1 and SWPG1 and to a node 306 and a MOS transistor SW2_REP having its gate connected to the gate of transistor SW2 and having its conduction nodes respectively connected to the common conduction node of transistors SW2 and SWPG2 and to a node 308. In operation, node 306 supplies a current IREP1 substantially proportional to the current flowing through transistor SW1, and node 308 supplies a current IREP2 substantially proportional to the current flowing through transistor SW2. Transistors SW1_REP, respectively SW2_REP, are for example reduced images of transistors SW1, respectively SW2, that is, they have substantially the same characteristics as transistors SW1, respectively SW2, except for their channel width, smaller than that of transistors SW1, respectively SW2, and thus for their on-state source-drain resistance, which is higher than that of transistors SW1, respectively SW2. Transistors SW1_REP and SW2_REP are selected so that the coefficients of proportionality between current IREP1 and the current flowing through transistor SW1 on the one hand, and between current IREP2 and the current flowing through transistor SW2 on the other hand, are substantially equal. Transistors SW1_REP and SW2_REP are for example substantially identical. In the shown example, transistors SW1_REP, respectively SW2_REP are P-channel MOS transistors having their sources connected to the sources of transistors SW1, respectively SW2, and having their drains connected to nodes 306, respectively 308.

Control circuit 301 of FIG. 3 further comprises a current comparator ICMP having a first input node e− coupled, on the one hand, to node 306 for supplying current IREP1 by a first switch K1 and, on the other hand, to node 308 for supplying current IREP2 by a second switch K2, and having a second input node e+ intended to receive a reference current IREVLIM. Current comparator ICMP comprises an output node s and is capable of supplying, onto node s, a voltage VIREVLIMB which switches level when the current applied to its input node e− reaches a level substantially equal to that of the current applied to its input node e+. Current comparator ICMP further comprises a power supply node p coupled to node 305 for supplying internal power supply voltage VMAX_INT. The forming of the current comparison circuit ICMP has not been detailed, the described embodiments being compatible with all or part of known current comparison circuits.

Control circuit 301 of FIG. 3 further comprises a voltage comparator VCMP having a first input node e− coupled, on the one hand, to node 101 of application of input power supply voltage VDD1 via a switch K3 and, on the other hand, to node 103 of application of input power supply voltage VDD2 via a switch K4, and having a second input node e+ coupled to node 102 for supplying voltage VCORE. Voltage comparator VCMP comprises an output node s and is capable of supplying, on node s, a voltage VCOVVDD which switches level when the voltage applied to its input node e+ reaches a level substantially equal to that of the voltage applied to its input node e−. Voltage comparator VCMP further comprises a power supply node p coupled to node 305 for supplying internal power supply voltage VMAX_INT. The forming of voltage comparison circuit VCMP has not been detailed, the described embodiments being compatible with all or part of known voltage comparison circuits.

In this example, control circuit 301 further comprises an asynchronous sequencing circuit (clockless) FSM, for example implementing a finite state machine. Sequencing circuit FSM comprises:

an output node s1 coupled to input node e2 of ramp generator RMP and capable of supplying control signal CTRLDW;

an output node s2 coupled to input node e1 of ramp generator RMP and capable of supplying control signal CTRLUP;

an output node s3 coupled to input node e3 of linear regulation circuit LDO1 and capable of supplying control signal SWON1;

an output node s4 coupled to input node e2 of linear regulation circuit LDO1 and capable of supplying control signal SWOFF1;

an output node s5 coupled to input node e3 of linear regulation circuit LDO2 and capable of supplying control signal SWON2;

an output node s6 coupled to input node e2 of linear regulation circuit LDO2 and capable of supplying control signal SWOFF2;

an output node s7 coupled to input node e4 of linear regulation circuit LDO2 and capable of supplying control signal EN_LDO2;

an output node s8 coupled to input node e4 of linear regulation circuit LDO1 and capable of supplying control signal EN_LDO1;

an output node s9 coupled to input node e1 of delay circuit DEL and capable of supplying control signal TRLOORHI;

an output node s10 coupled to the gate of transistor SWPG1 and capable of supplying a voltage EN_SWPG1 for controlling the setting of transistor SWPG1 to the off state or to the on state;

an output node s11 coupled to the gate of transistor SWPG2 and capable of supplying a voltage EN_SWPG2 for controlling the setting of transistor SWPG2 to the off state or to the on state;

an output node s12 coupled to the gate of transistor SWPGVMAX and capable of supplying a voltage EN_SWPGVMAX for controlling the setting of transistor SWPGVMAX to the off state or to the on state;

an input node e1 coupled to output node s of voltage comparator VCMP and capable of receiving output voltage VCOVVDD of comparator VCMP;

an input node e2 coupled to output node s of delay circuit DEL and capable of receiving output voltage TRLOORHI_DEL of circuit DEL; and an input node e3 coupled to output node s of current comparator ICMP and capable of receiving output voltage VIREVLIMB of comparator ICMP.

In the shown example, sequencing circuit FSM further comprises a control input 310 over one or a plurality of bits (DIGBUS[1:x]) enabling to control the setting of the voltage selection circuit to the first configuration (transistors SW1 and SW2 respectively turned on and off) or to the second configuration (transistors SW1 and SW2 respectively off and on) and, possibly, to configure certain parameters of circuit 301. Sequencing circuit FSM further comprises a power supply node p1 coupled to node 303 for supplying voltage VMAX. In this example, sequencing circuit FSM further comprises a power supply node p2 coupled to node 312 of application of voltage VANA. The forming of sequencing circuit FSM has not been detailed, the forming of such a circuit being within the abilities of those skilled in the art based on the functional indications described in the present application.

Figure 4:
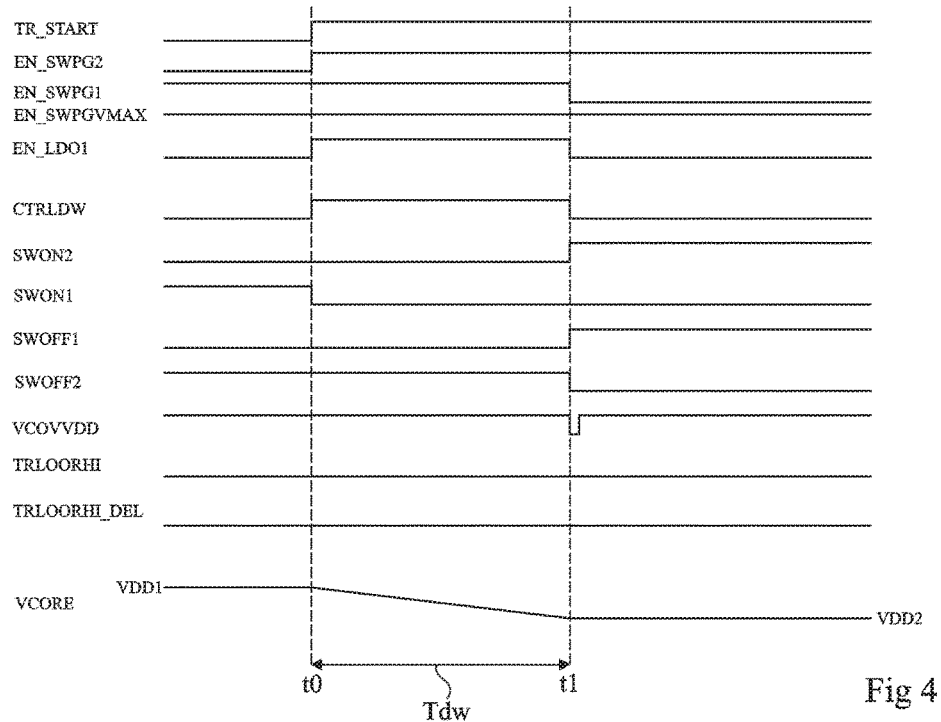
FIGS. 4 and 5 are timing diagrams illustrating an example of an operating mode of the circuit of FIG. 3.
Figure 5:
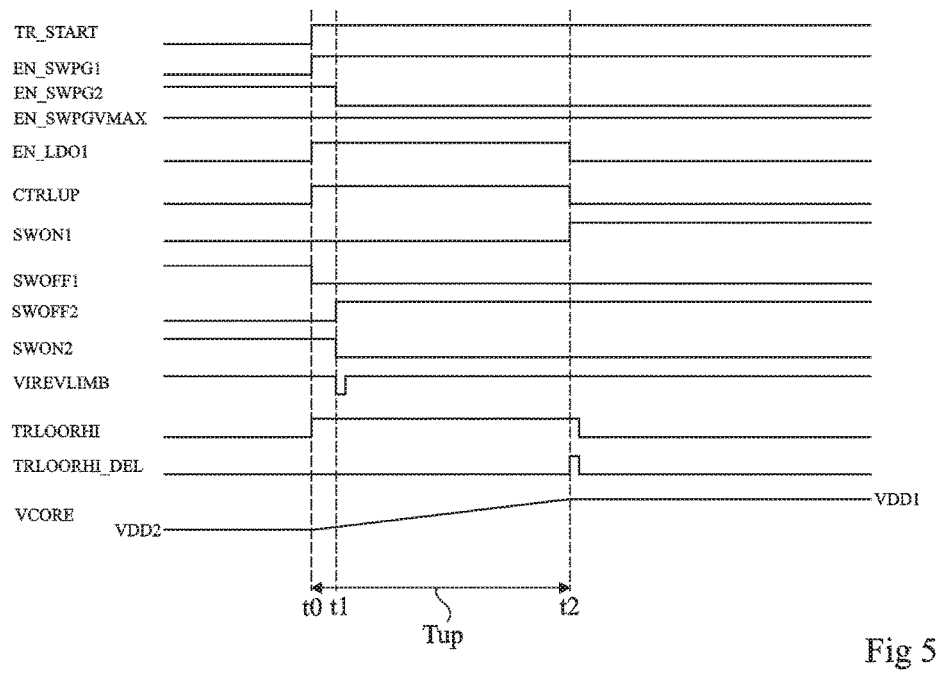

FIGS. 4 and 5 are timing diagrams schematically illustrating an example of an operating mode of the power supply voltage selection circuit of FIG. 3.

In this example, it is considered that input power supply voltage VDD1 is greater than input power supply voltage VDD2. In this configuration, during phases of transition of the selection circuit, switches K1 and K2 are kept respectively off (non-conducting) and on (conducting), to couple input node e+ of current comparator ICMP to node 308 for supplying current IREP2, and switches K3 and K4 are kept respectively off and on, to couple input node e− of voltage comparator VCMP to node 103 of application of voltage VDD2.

FIG. 4 illustrates the circuit operation during a decreasing transition phase, that is, during a phase of transition from the first configuration (transistors SW1 and SW2 respectively on and off) to the second configuration (transistors SW1 and SW2 respectively off and on). FIG. 4 more particularly shows the time variation of signals EN_SWPG2, EN_SWPG1, EN_SWPGVMAX, EN_LDO1, CTRL_DW, SWON2, SWON1, SWOFF1, SWOFF2, VCOVVDD, TRLOORHI, TRLOORHI_DEL, and VCORE of the circuit during a decreasing transition phase. FIG. 4 further shows the time variation of a signal TR_START for controlling a transition of the selection circuit between the first and second configurations. In this example, it is considered that signals TR_START, EN_SWPG2, EN_SWPG1, EN_SWPGVMAX, EN_LDO1, CTRLDW, SWON2, SWON1, SWOFF1, SWOFF2, VCOVVDD, TRLOORHI, TRLOORHI_DEL are binary signals capable of each taking either a high state, or a low state (that is, lower than the high state).

Before the beginning of the decreasing transition phase, the selection circuit is in the first configuration (transistors SW1 and SW2 respectively on and off). In this configuration, signal TR_START is in the low state, signal EN_SWPG2 is in the low state to keep transistor SWPG2 off, signal EN_SWPG1 is in the high state to keep transistor SWPG1 on, signal EN_SWPGVMAX is in the high state to maintain transistor SWPGVMAW on, signal EN_LDO1 is in the low state to deactivate the linear regulation function of circuit LDO1, signal CTRLDW is in the low state, signals SWON1 and SWOFF1 are respectively in the high state and in the low state to force the keeping in the on state of transistor SW1 by circuit LDO1, signals SWON2 and SWOFF2 are respectively in the low state and in the high state to force the keeping in the off state of transistor SW2 by circuit LDO2, output signal VCOVVDD of comparator VCMP is in the high state, input and output signals TRLOORHI and TRLOORHI_DEL of the delay circuit DEL are in the low state, and voltage VCORE is substantially equal to voltage VDD1.

At a time t0 of beginning of a decreasing transition phase, signal TR_START switches to the high state. At this time, signal EN_SWPG2 is set to the high state to turn on transistor SWPG2. Further, signal EN_LDO1 is set to the high state to activate the function of linear regulation of circuit LDO1, and signal SWON1 is set to the low state to stop forcing the keeping in the on state of transistor SW1 by circuit LDO1. Further, signal CTRLDW is set to the high state, to control the supply of a decreasing voltage ramp by ramp generation circuit RMP. Circuit RMP then generates on its output node s a voltage VCTRL continuously decreasing from value VDD1 to value VDD2 according to a predetermined ramp. Voltage VCTRL is applied to target input e5 of linear regulation circuit LDO1. Circuit LDO1 then regulates the control signal applied to the gate of transistor SW1 to copy set point voltage VCTRL onto node 102. Voltage VCORE then continuously decreases, for example, linearly, from value VDD1 to value VDD2, by substantially following the target slope generated by circuit RMP.

At a time t1 subsequent to time t0, voltage VCORE reaches level VDD2, which causes a state switching (switching to the low level in this example) of output voltage VCOVVDD of voltage comparator VCMP. Such a state switching of signal VCOVVDD is detected by sequencing circuit FSM, and marks the end of the decreasing transition phase. Signal EN_LDO1 is then set to the low state to interrupt the linear regulation function implemented by circuit LDO1, and signal SWOFF1 is set to the high state to control the turning off of transistor SW1 by circuit LDO1. Further, signals SWON2 and SWOFF2 are respectively set to the high state and to the low state, to control the turning on of transistor SW2 by circuit LDO2. Further, signal EN_SWPG1 is set to the low state, to control the turning off of transistor SWPG1. Signal CTRLDW is further set back to the low state. As an example, duration $T_{dw}$=t1− of the decreasing transition, substantially corresponding to the time taken by voltage ramp VCTRL to switch from value VDD1 to value VDD2, is set to a value in the range from 10 ns to 1 ms, for example, in the order of 100 ns.

FIG. 5 illustrates the circuit operation during an increasing transition phase, that is, during a phase of transition from the second configuration (transistors SW1 and SW2 respectively off and on) to the first configuration (transistors SW1 and SW2 respectively on and off). FIG. 5 more particularly shows the time variation of signals TR_START, EN_SWPG1, EN_SWPG2, EN_SWPGVMAX, EN_LDO1, CTRLUP, SWON1, SWOFF1, SWOFF2, SWON2, VIREVLIMB, TRLOORHI, TRLOORHI_DEL, and VCORE of the circuit during an increasing transition phase. As in the example of FIG. 4, it is considered that signals TR_START, EN_SWPG1, EN_SWPG2, EN_SWPGVMAX, EN_LDO1, CTRLUP, SWON1, SWOFF1, SWOFF2, SWON2, VIREVLIMB, TRLOORHI, TRLOORHI_DEL are binary signals capable of each taking either a high or a low state.

Before the beginning of the increasing transition phase, the selection circuit is in the second configuration (transistors SW1 and SW2 respectively off and on). In this configuration, signal TR_START is in the low state, signal EN_SWPG1 is in the low state to keep transistor SWPG1 off, signal EN_SWPG2 is in the high state to keep transistor SWPG2 on, signal EN_SWPGVMAX is in the high state to keep transistor SWPGVMAW on, signal EN_LDO1 is in the low state to deactivate the linear regulation function of circuit LDO1, signal CTRLUP is in the low state, signals SWON1 and SWOFF1 are respectively in the low state and in the high state to force the keeping in the off state of transistor SW1 by circuit LDO1, signals SWON2 and SWOFF2 are respectively in the high state and in the low state to force the keeping in the on state of transistor SW2 by circuit LDO2, output signal VIREVLIMB of comparator ICMP is in the high state, input and output signals TRLOORHI and TRLOORHI_DEL of the delay circuit DEL are in the low state, and voltage VCORE is substantially equal to voltage VDD2.

At a time t0 of beginning of an increasing transition phase, signal TR_START switches to the high state. At this time, signal EN_SWPG1 is set to the high state to turn on transistor SWPG1. Further, signal EN_LDO1 is set to the high state to activate the function of linear regulation of circuit LDO1, and signal SWOFF1 is set to the low state to stop forcing the keeping in the off state of transistor SW1 by circuit LDO1. Further, signal CTRLUP is set to the high state, to control the supplying of an increasing voltage ramp by ramp generation circuit RMP. Circuit RMP then generates on its output node s a voltage VCTRL continuously increasing from value VDD2 to value VDD1 according to a predetermined ramp. Voltage VCTRL is applied to target input e5 of linear regulation circuit LDO1. Circuit LDO1 then regulates the control signal applied to the gate of transistor SW1 to copy target voltage VCTRL onto node 102. Voltage VCORE then continuously increases, for example, linearly, from value VDD2 to value VDD1, by substantially following the target slope generated by circuit RMP. At time t0, the state of signal TRLOORHI is further modified (set to the high state in this example), to start the generation of a delay by circuit DEL.

At a time t0 subsequent to time t0, voltage VCORE reaches a level such that the current flowing through transistor SW2 tends to reverse. Such a reversal is detected by current comparison circuit ICMP, which compares a current IREP2 proportional to the current flowing through transistor SW2 with a reference current IREVLIM, for example equal or close to zero, for example in the range from 0 to 10 mA. Time t1 corresponds in this example to the state switching time of output voltage VIREVLIMB of current comparator ICMP, when current IREP2 reaches level IREVLIM. The state switching is detected by sequencing circuit FSM. Signals SWON2 and SWOFF2 are then respectively set to the low state and to the high state, to control the turning off of transistor SW2 by circuit LDO2. Further, signal EN_SWPG2 is set to the low state to turn off transistor SWPG2.

At a time t2 subsequent to time t1, the delay generated by delay circuit DEL expires, that is, signal TRLOORHI_DEL switches state (switches to the high state in this example). Duration t2−t0 is a predetermined duration set by delay circuit DEL. This duration is selected to be at least equal to the time taken by voltage ramp VCTRL generated by circuit RMP to switch from value VDD2 to value VDD1. Thus, at time t2, voltage VCORE is substantially equal to voltage VDD1. Time t2 marks the end of the increasing transition phase. The state switching of signal TRLOORHI_DEL is detected by sequencing circuit FSM. Signal EN_LDO1 is then set to the low state to interrupt the linear regulation function implemented by circuit LDO1, and signal SWON1 is set to the high state to control the turning on of transistor SW1 by circuit LDO1. Signals CTRLUP, TRLOORHI, and TRLOORHI_DEL may further be set back to the low state until a new decreasing transition occurs. As an example, duration $T_{up}$=t2−t0 of the increasing transition, set by delay circuit DEL and substantially corresponding to the time taken by voltage ramp VCTRL to switch from value VDD2 to value VDD1, is set to a value in the range from 10 ns to 1 ms, for example, in the order of 100 ns.

An advantage of the circuit of FIG. 3 is that it enables to control the variations of voltage VCORE during phases of transition between the first and second configurations of the voltage selection circuit.

Further, the circuit of FIG. 3 enables to control the reverse current likely to flow in transistor SW2 during decreasing transition phases.

Further, in the circuit of FIG. 3, the control of the transitions between the first and second configuration is performed asynchronously, and requires no clock signal.

Further, the circuit of FIG. 3 has a relatively low electric power consumption and bulk.

The architecture of FIG. 3 may easily be repeated, for example in a plurality of regions of an integrated circuit chip, to achieve a switchable distributed power supply between two levels VDD1 and VDD2.

Further, the architecture of FIG. 3 may easily be adapted to increase the number of input power supply voltages, that is, to form a circuit enabling to select a power supply voltage VCORE from among a number of input power supply voltages VDDi greater than 2.

Another advantage of the circuit of FIG. 3 is that its behavior during phases of transition between the first and second configurations is independent from the charge current drawn by the load circuit from node 102.

Further, the circuit of FIG. 3 generates no ripple of voltage VCORE on node 102 during transition phases.

Figure 6:
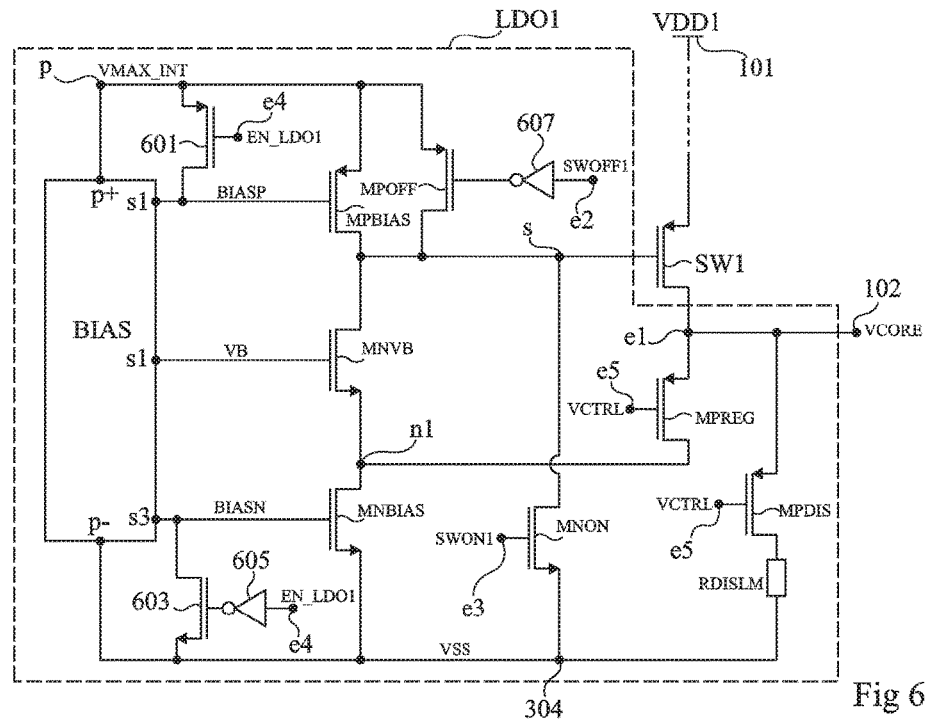
FIG. 6 is an electric diagram of an embodiment of a linear voltage regulation circuit of the circuit of FIG. 3.

FIG. 6 is an electric diagram of an embodiment of a circuit of linear regulation of voltage LDO1 of the circuit of FIG. 3. As in FIG. 6, in addition to circuit LDO1, power transistor SW1, as well as nodes 101 (VDD1), 102 (VCORE), and 304 (VSS) of the voltage selection circuit have been shown.

Circuit LDO1 of FIG. 6 comprises a bias circuit (BIAS) having a high power supply node p+ connected to power supply node p of circuit LDO1 and having a low power supply node p− connected to node 304 (VSS) corresponding to the circuit ground. Bias circuit BIAS comprises a node s1 for supplying a bias voltage BIASP, a node s2 for supplying a bias voltage VB, and a node s3 for supplying a bias voltage BIASN. Circuit LDO1 further comprises a MOS transistor 601 coupling, via its conduction nodes, power supply node p of circuit LDO1 to output node s1 of bias circuit BIAS, and a MOS transistor 603 coupling, via its conduction nodes, output node s3 of bias circuit BIAS to node 304. In this example, transistor 601 is a P-channel MOS transistor having its source connected to node p and having its drain connected to node s1, and transistor 603 is an N-channel MOS transistor having its source connected to node 304 and having its drain connected to node s3. The gate of transistor 601 is connected to node e4 of application of enable control signal EN_LDO1 of circuit LDO1, and the gate of transistor 603 is coupled to the same node e4, but via an inverter 605, so that transistors 601 and 603 are controlled to be simultaneously set to the off state or simultaneously to the on state according to the state of signal EN_LDO1. Circuit LDO1 of FIG. 6 further comprises a MOS transistor MPBIAS coupling, via its conduction nodes, power supply node p of circuit LDO1 to its output node s, that is, to the gate of transistor SW1. In this example, transistor MPBIAS is a P-channel MOS transistor having its source connected to node p and having its drain connected to node s. The gate of transistor MPBIAS is connected to output node s1 of circuit BIAS. Circuit LDO1 further comprises a MOS transistor MNVB coupling, via its conduction nodes, output node s of circuit LDO1 to an intermediate node n1, and a MOS transistor MNBIAS coupling, via its conduction nodes, node n1 to node 304. In this example, transistors MNVB and MNBIAS are N-channel MOS transistors. The drain and the source of transistor MNVB are respectively connected to node s and to node n1, and the drain and the source of transistor MNBIAS are respectively connected to node n1 and to node 304. The gate of transistor MNVB is connected to output node s2 of circuit BIAS, and the gate of transistor MNBIAS is connected to output node s3 of circuit BIAS. Circuit LDO1 of FIG. 6 further comprises a MOS transistor MPREG coupling, via its conduction nodes, input node e1 of circuit LDO1, that is, node 102 for supplying voltage VCORE, to internal node n1. In this example, transistor MPREG is a P-channel MOS transistor having its source connected to node e1 and having its drain connected to node n1. The gate of transistor MPREG is connected to node e5 of application of target voltage VCTRL. In this example, circuit LDO1 further comprises a MOS transistor MPDIS series-coupled, via its conduction nodes, to a resistor RDISLIM, between input node e1 of circuit LDO1 and node 304. In this example, transistor MPDIS is a P-channel MOS transistor having its source connected to node e1 and having its drain connected to a first end of resistor RDISLIM, the second end of resistor RDISLIM being connected to node 304. The gate of transistor MPDIS is connected to node e5 of application of target voltage VCTRL. Circuit LDO1 of FIG. 6 further comprises a MOS transistor MPOFF coupling, via its conduction nodes, power supply node p of circuit LDO1 to its output node s, and a MOS transistor MPON connecting, via its conduction nodes, node 304 to node s. In this example, transistors MPOFF and MPON respectively are a P-channel MOS transistor and an N-channel MOS transistor. The source and the drain of transistor MPOFF are respectively connected to node p and to node s, and the source and the drain of transistor MNON are respectively connected to node 304 and to node s. The gate of transistor MNON is connected to node e3 of application of control signal SWON1, and the gate of transistor MPOFF is coupled to node e2 of application of control signal SWOFF1 via an inverter 607.

Figure 7:
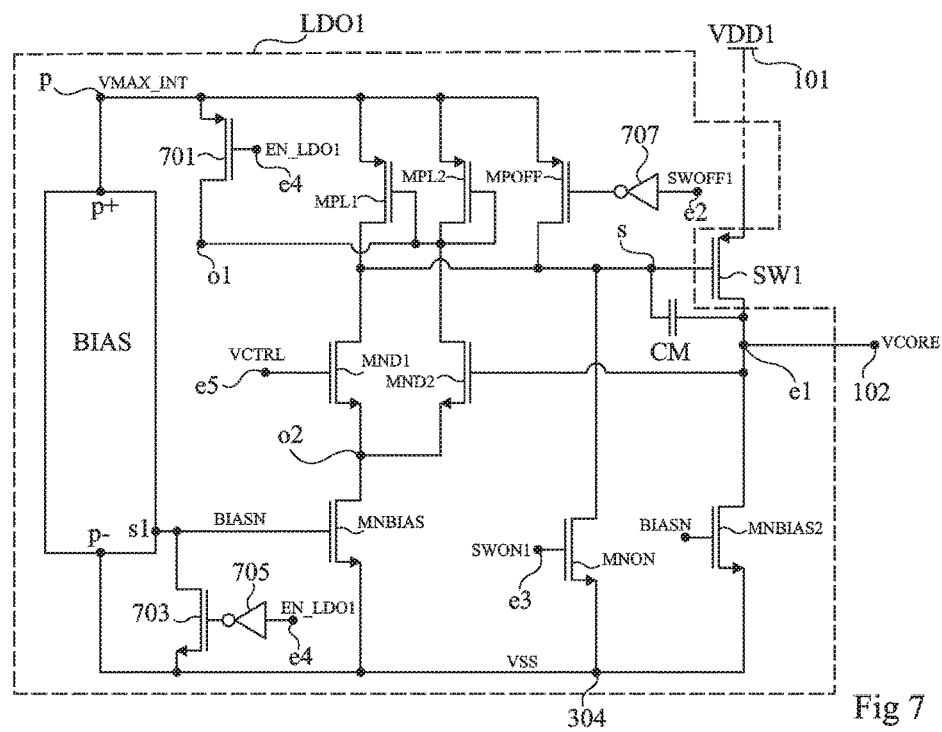
FIG. 7 is an electric diagram of another embodiment of a linear voltage regulation circuit of the circuit of FIG. 3.

FIG. 7 is an electric diagram of another embodiment of a circuit of linear regulation of voltage LDO1 of the circuit of FIG. 3. As in FIG. 6, in addition to circuit LDO1, power transistor SW1, as well as nodes 101 (VDD1), 102 (VCORE), and 304 (VSS) of the voltage selection circuit have been shown.

Circuit LDO1 of FIG. 7 comprises a bias circuit (BIAS) having a high power supply node p+ connected to power supply node p of circuit LDO1 and having a low power supply node p− connected to node 304 (VSS) corresponding to the circuit ground. Bias circuit BIAS comprises a node s1 for supplying a bias voltage BIASN. Circuit LDO1 further comprises a MOS transistor 701 coupling, via its conduction nodes, power supply node p of circuit LDO1 to an internal node o1, and a MOS transistor 703 coupling, via its conduction nodes, output node s1 of bias circuit BIAS to node 304. In this example, transistor 701 is a P-channel MOS transistor having its source connected to node p and having its drain connected to node o1, and transistor 703 is an N-channel MOS transistor having its source connected to node 304 and having its drain connected to node s1. The gate of transistor 701 is connected to node e4 of application of enable control signal EN_LDO1 of circuit LDO1, and the gate of transistor 703 is coupled to the same node e4, but via an inverter 705, so that transistors 701 and 703 are controlled to be simultaneously set to the off state or simultaneously to the on state according to the state of signal EN_LDO1. Circuit LDO1 of FIG. 7 further comprises a MOS transistor MPL1 coupling, via its conduction nodes, power supply node p of circuit LDO1 to its output node s, that is, to the gate of transistor SW1. In this example, transistor MPL1 is a P-channel MOS transistor having its source connected to node p and having its drain connected to node s. The gate of transistor MPL1 is connected to output node o1. Circuit LDO1 further comprises a MOS transistor MND1 coupling, via its conduction nodes, output node s of circuit LDO1 to an intermediate node o2, and a MOS transistor MNBIAS coupling, via its conduction nodes, node o2 to node 304. In this example, transistors MND1 and MNBIAS are N-channel MOS transistors. The drain and the source of transistor MND1 are respectively connected to node s and to node o2, and the drain and the source of transistor MNBIAS are respectively connected to node o2 and to node 304. The gate of transistor MND1 is connected to node e5 of application of target voltage VCTRL, and the gate of transistor MNBIAS is connected to output node s1 of circuit BIAS. Circuit LDO1 of FIG. 7 further comprises a MOS transistor MPL2 coupling, via its conduction nodes, power supply node p of circuit LDO1 to node o1, and a MOS transistor MND2 coupling, via its conduction nodes, node o1 to node o2. In this example, transistors MPL2 and MND2 respectively are a P-channel MOS transistor and an N-channel MOS transistor. The drain and the source of transistor MPL2 are respectively connected to node o1 and to node p, and the drain and the source of transistor MND2 are respectively connected to node o1 and to node o2. The gate of transistor MPL2 is connected to node o1, and the gate of transistor MND2 is connected to input node e1 of circuit LDO1, that is, to node 102 for supplying voltage VCORE. Circuit LDO1 of FIG. 7 further comprises a MOS transistor MPOFF coupling, via its conduction nodes, power supply node p of circuit LDO1 to its output node s, and a MOS transistor MPON coupling, via its conduction nodes, node 304 to node s. In this example, transistors MPOFF and MPON respectively are a P-channel MOS transistor and an N-channel MOS transistor. The source and the drain of transistor MPOFF are respectively connected to node p and to node s, and the source and the drain of transistor MNON are respectively connected to node 304 and to node s. The gate of transistor MNON is connected to node e3 of application of control signal SWON1, and the gate of transistor MPOFF is coupled to node e2 of application of control signal SWOFF1 via an inverter 707. Regulation circuit LDO1 of FIG. 7 further comprises a MOS transistor MNBIAS2 coupling, via its conduction nodes, node e1 to node 304. In this example, transistor MNBIAS2 is an N-channel MOS transistor having its source and its drain respectively connected to node 304 and to node e1. The gate of transistor MNBIAS2 is connected to output node s1 of bias circuit BIAS. Circuit LDO1 of FIG. 7 further comprises a capacitor CM having a first electrode coupled to node s and having its second electrode coupled to node e1.

Specific embodiments have been described. Various alterations, modifications, and improvements will occur to those skilled in the art. In particular, the circuit of FIG. 3 may be simplified when it is known in advance which of input power supply voltage VDD1 and VDD2 is the highest. For example, when it is known in advance that voltage VDD1 is greater than voltage VDD2, linear regulation circuit LDO2 may be omitted, transistor SW2 then no longer being controlled to be set to the off state or to the on state. Further, transistor SW1_REP for measuring the current flowing through transistor SW1 may be omitted. Further, switches K1, K2, K3, K4 may be suppressed, input nodes e− of comparator ICMP and e− of comparator VCMP then being respectively directly coupled to node 308 for supplying current IREP2 and to node 103 of application of voltage VDD2. Further, nodes 303 and 101 may be confounded.

Further, in the circuit described in relation with FIG. 3, the circuit formed by transistors SW1_REP and SW2_REP and by current comparator ICMP may be replaced with any other circuit capable of detecting a reversal of the current flowing through transistor SW2 or through transistor SW1.

Further, as a variation to the use of delay circuits DEL to detect the end of the increasing transitions, it may be provided to compare voltage VCORE supplied by node 102 with the highest of power supply voltages VDD1 and VDD2, for example by using voltage comparator VCMP.

Further, leakage limiting transistors SWPG1, SWPG2, SWPGMAX may be omitted. In this case, the sources of transistors SW1, respectively SW2, may be directly connected to nodes 101, respectively 103, and nodes 305 and 303 may be confounded.

Such alterations, modifications, and improvements are intended to be part of this disclosure, and are intended to be within the spirit and scope of the present invention. Accordingly, the foregoing description is by way of example only and is not intended to be limiting. The present invention is limited only as defined in the following claims and the equivalents thereto.

What is claimed is:

1. A power supply voltage selection circuit, comprising:
    first and second nodes capable of respectively receiving a first input power supply voltage and a second input power supply voltage smaller than the first voltage;
    a third node capable of supplying an output power supply voltage;
    a first MOS power transistor coupling the first node to the third node;
    a second MOS power transistor coupling the second node to the third node; and
    a control circuit capable, in a first configuration, of keeping the first and second transistors respectively on and off to apply the first input power supply voltage to the third node and, in a second configuration, of keeping the first and second transistors respectively off and on to apply the second input power supply voltage to the third node,
    the control circuit comprising a feedback loop from the third node to the gate of the first transistor, and being configured to, during a phase of transition from the first to the second configuration or from the second to the first configuration, linearly control the first transistor to apply a continuous voltage ramp to the third node.

2. The selection circuit of claim 1, wherein the control circuit comprises:
    a voltage ramp generator; and
    a first linear regulation circuit having a first input node connected to the third node, having a second input node connected to an output node of the ramp generator, and having an output node connected to the gate of the first transistor.

3. The selection circuit of claim 2, wherein the first linear regulation circuit is capable of adjusting a control signal applied, via its output node, to the gate of the first transistor, to control the output voltage with a target voltage applied to its second input node.

4. The selection circuit of claim 2, further comprising a second linear regulation circuit having a first input node connected to the third node, having a second input node connected to the output node of the ramp generator, and having an output node connected to the gate of the second transistor.

5. The selection circuit of claim 1, further comprising a circuit for detecting a reversal of the current flowing through the second transistor.

6. The selection circuit of claim 5, wherein the detection circuit comprises a measurement transistor arranged to conduct a measurement current proportional to the current flowing through the second transistor, and a current comparator capable of comparing said measurement current with a threshold.

7. The selection circuit of claim 1, further comprising a circuit (VCMP) for comparing the output voltage (VCORE) with a threshold.

8. The selection circuit of claim 1, further comprising a circuit (DEL) for generating a predetermined delay.

9. The selection circuit of claim 1, wherein the first MOS power transistor (SW1) is coupled to the first node (101) via a first additional MOS transistor having off-state leakage currents smaller than that of the first MOS power transistor, and wherein the second MOS power transistor is coupled to the second node via a second additional MOS transistor having off-state leakage currents smaller than that of the second MOS power transistor.

10. The selection circuit of claim 9, wherein the control circuit is capable, in a third configuration, of keeping the first and second MOS power transistors and the first and second additional MOS transistors in the off state.

11. The selection circuit of claim 1, wherein the control circuit is configured, during a phase of transition between the first and second configurations, to:
    linearly control the first transistor to apply a decreasing continuous voltage ramp onto the third node;
    detect a switching of the output voltage to a level substantially equal to that of the second input power supply voltage; and
    when the output voltage reaches a level substantially equal to that of the second input power supply voltage, turn on the second MOS power transistor and turn off the first MOS power transistor.

12. The selection circuit of claim 1, wherein the control circuit is configured, during a phase of transition between the first and second configurations, to:
- linearly control the first transistor to apply an increasing continuous voltage ramp onto the third node;
- detect an inversion of the current flowing through the second transistor;
- when the current flowing through the second transistor reverses, turn off the second transistor; and
- after a predetermined delay, turn on the first MOS power transistor.

* * * * *